(12) United States Patent
Kawate et al.

(10) Patent No.: US 8,911,266 B2
(45) Date of Patent: Dec. 16, 2014

(54) CONTACT HOLDER

(75) Inventors: Yoshihisa Kawate, Tokyo (JP); Yuichi Tsubaki, Kanagawa (JP); Masahiko Kobayashi, Kanagawa (JP)

(73) Assignee: 3M Innovative Properties Company, St. Paul, MN (US)

( * ) Notice: Subject to any disclaimer, the term of this patent is extended or adjusted under 35 U.S.C. 154(b) by 65 days.

(21) Appl. No.: 13/697,185

(22) PCT Filed: May 26, 2011

(86) PCT No.: PCT/US2011/038064
§ 371 (c)(1),
(2), (4) Date: Nov. 9, 2012

(87) PCT Pub. No.: WO2011/153054
PCT Pub. Date: Dec. 8, 2011

(65) Prior Publication Data
US 2013/0065455 A1    Mar. 14, 2013

(30) Foreign Application Priority Data
Jun. 1, 2010    (JP) .................... 2010-126062

(51) Int. Cl.
| | | |
|---|---|---|
| H01R 13/24 | (2006.01) | |
| G01R 1/04 | (2006.01) | |
| H01L 23/32 | (2006.01) | |
| H01R 12/71 | (2011.01) | |
| H01R 13/6596 | (2011.01) | |

(52) U.S. Cl.
CPC .......... *H01R 13/2421* (2013.01); *G01R 1/0483* (2013.01); *H01L 23/32* (2013.01); *H01R 12/714* (2013.01); *H01R 13/6596* (2013.01); *G01R 1/045* (2013.01); *H01L 2924/0002* (2013.01)
USPC ......................................... 439/700

(58) Field of Classification Search
USPC ........ 439/700, 92, 59, 95; 174/260, 262, 264; 361/400, 414, 785, 794–795
See application file for complete search history.

(56) References Cited

U.S. PATENT DOCUMENTS

| | | | |
|---|---|---|---|
| 5,036,301 A * | 7/1991 | Takao et al. ................... | 333/185 |
| 5,480,309 A | 1/1996 | Arisaka | |
| 5,502,397 A | 3/1996 | Buchanan | |

(Continued)

FOREIGN PATENT DOCUMENTS

| | | |
|---|---|---|
| EP | 1 041 631 | 10/2000 |
| EP | 1 478 215 | 11/2004 |

(Continued)

OTHER PUBLICATIONS

PCT International Search Report from PCT/US2011/038064 dated Nov. 28, 2011, 4 pages.

*Primary Examiner* — Jean F Duverne
(74) *Attorney, Agent, or Firm* — Robert S. Moshrefzadeh

(57) ABSTRACT

To provides a contact holder, capable of compensating a change of signal transmission characteristic at the outer edge area of the substrate. A substrate 21 has grounding conductive layers 291, 292 arranged on or above surfaces 212, 213 of the substrate, near a plunger of a signal transmitting contact 3b. Each grounding conductive layer is electrically connected to a conductive portion 241 electrically connected to each grounding contact, on surface 212 or 213 of substrate 21. Further, each grounding conductive layer is not electrically connected to the signal transmitting contact.

6 Claims, 7 Drawing Sheets

(56) References Cited

U.S. PATENT DOCUMENTS

| | | |
|---|---|---|
| 5,854,534 A | 12/1998 | Beilin et al. |
| 6,340,838 B1 | 1/2002 | Chung et al. |
| 6,512,389 B1 | 1/2003 | Kocher |
| 6,891,258 B1 | 5/2005 | Alexander et al. |
| 7,129,728 B2 | 10/2006 | Kinoshita |
| 7,477,062 B2 | 1/2009 | Kinoshita |
| 7,927,109 B1 | 4/2011 | Gattuso |
| 2002/0115313 A1 | 8/2002 | Chung et al. |
| 2002/0180469 A1 | 12/2002 | Wu et al. |
| 2003/0134526 A1 | 7/2003 | Cheng |
| 2004/0137767 A1 | 7/2004 | Suzuki et al. |
| 2004/0145877 A1 | 7/2004 | Fujiyama et al. |
| 2004/0147140 A1 | 7/2004 | Fan et al. |
| 2004/0179339 A1 | 9/2004 | Mayer |
| 2004/0196025 A1 | 10/2004 | Casey et al. |
| 2005/0145842 A1 | 7/2005 | Maekawa et al. |
| 2006/0046554 A1 | 3/2006 | Cram et al. |
| 2006/0132160 A1 | 6/2006 | Kinoshita |
| 2006/0138612 A1* | 6/2006 | Lee ................. 257/659 |
| 2007/0187708 A1* | 8/2007 | Setomoto et al. ............. 257/99 |
| 2007/0252609 A1 | 11/2007 | Liang et al. |
| 2008/0139017 A1 | 6/2008 | Kiyofuji et al. |
| 2009/0085593 A1 | 4/2009 | Yoshida et al. |
| 2010/0200280 A1 | 8/2010 | Tamura |
| 2011/0001505 A1 | 1/2011 | Nam |
| 2011/0210997 A1* | 9/2011 | Tamaru et al. ............. 347/9 |

FOREIGN PATENT DOCUMENTS

| | | |
|---|---|---|
| JP | S62-96578 U | 6/1987 |
| JP | 2001 249163 | 9/2001 |
| JP | 2001-271411 | 10/2001 |
| JP | 2003 050262 | 2/2003 |
| JP | 3099091 | 3/2004 |
| JP | 2005-049163 | 2/2005 |
| JP | 2007-198835 | 8/2007 |
| JP | 2009-85948 | 4/2009 |
| JP | 2009 270835 | 11/2009 |
| KR | 2003 16 878 | 6/2003 |
| WO | WO 99/41812 | 8/1999 |
| WO | WO 02/27335 | 4/2002 |
| WO | WO 2005/006003 | 1/2005 |
| WO | WO 2006/062911 | 6/2006 |
| WO | WO 2008/055003 | 5/2008 |

* cited by examiner

CONTACT HOLDER

TECHNICAL FIELD

The present invention relates to a contact holder used to test an electronic device such as a CPU or a memory, and in particular, relates to a contact holder for testing a semiconductor package.

BACKGROUND

In carrying out an evaluation test of signal transmission property or the like of an electronic device such as a BGA (ball grid array) device, a contact holder, having contacts each connectable to each terminal of the electronic device, is used. In recent years, a frequency of a signal used in the electronic device becomes higher, as a processing speed of the electronic device becomes higher. Corresponding to such a high-speed signal, the contact holder is also required to transmit the high-speed signal.

In transmitting a signal (in particular, a high-speed signal), it is important to maintain a characteristic impedance of a transmission line for transmitting the signal at a desired value, throughout the transmission line. To this end, a metallic block structure, provided with a coaxial transmission line having predetermined characteristic impedance, has been proposed.

For example, Patent Literature 1 describes that "a dielectric layer 15 is disposed on the periphery of a contact probe 10 via a second metallic film 16, and a first metallic film 17 is disposed on an outer surface of dielectric layer 15. Due to this, a capacitor 18 is formed between second metallic film 16 (movable pins 11, 12) and first metallic film 17 (a metallic sleeve 9)."

Patent Literature 2 describes that "a contact probe 21 for transmitting a high-frequency signal has annular probe holders 31 fixed to two parts on the periphery of contact probe 21, and probe holders 31 are fitted into a through hole 3 so that probe holders are positioned at upper and lower part of a metallic block 2. Due to this, a hollow portion is defined between contact probe 21 and metallic block 2, and a coaxial transmission line, having contact probe 21 as an inner conductor and metallic block 2 as an outer conductor, is formed, which has desired characteristic impedance."

Patent Literature 3 describes that "a substrate 21 has a front surface where an array of front side electrodes 22 are formed and a back surface where back side electrodes 23 connected to front side electrodes 22 are formed. On both surfaces of substrate 21, upper and lower guide plates 25 and 26 are positioned, wherein an anisotropically conductive adhesive sheet 27 is positioned between each surface of the substrate and each guide plate. Upper and lower guide plate 25 and 26 have through holes 28 and 29, where a coil-shaped contact 31 is positioned."

CITATION LIST

Japanese Unexamined Patent Publication (Kokai) No. 2005-49163

Japanese Unexamined Patent Publication (Kokai) No. 2007-198835

Japanese Unexamined Patent Publication (Kokai) No. 2000-82553

SUMMARY

As an example of the above contact, a contact, having an outer shell and plungers positioned at both ends the outer shell so as to apply contact force to a contact point. In addition, so-called a spring probe, at least one of plungers of which is movably inserted into an outer shell by means of a spring, may be used. Generally, a high-frequency transmission characteristic of an electronic device depends on the shapes of conductive material and dielectric material around the conductive material, the positional relationship between the conductive material and the other relating conductive body, and material constants thereof. In other words, the characteristic impedance may be controlled close to a desired value within a substrate, by forming a pseudo coaxial structure including the contact, etc. However, in an outer edge area of the substrate, it is difficult to uniformize the signal transmission characteristic, in particular when the spring probe is used.

For example, when a through hole, having a constant diameter and a plated inner surface, is formed in a multi-layer substrate having the thickness larger than the length of the outer shell of the spring probe, and then a contact such as the spring probe is inserted into the through hole, a front end of the plunger of the spring probe projects from a surface of the substrate. Further, the thickness of the projecting portion is different from the plated conductive of the through hole. As such, the contact having the non-constant diameter has uneven high-frequency transmission characteristic. Therefore, if the transmission characteristic is controlled at the outer shell, the transmission characteristic at the plunger is different, and desired transmission characteristic may not be obtained.

Thus, the invention provides a contact holder, capable of compensating a change of signal transmission characteristic at the outer edge area of the substrate.

In order to achieve the object of the invention described above, the present invention provides a contact holder adapted to contact a plurality of terminals of an electronic device to corresponding contacts of a circuit board, comprising: an insulating substrate; a plurality of conductive contacts, each inserted into and held in each of a plurality of holes formed in the substrate, wherein the substrate has a conductive layer for grounding positioned on or above a surface of the substrate, the conductive layer for grounding being grounded and electrically insulated from the contacts, and wherein the conductive layer for grounding is arranged so that a surface of the conductive layer for grounding is generally perpendicular to an axial direction of the contact.

In a preferred embodiment, a distance, in the direction perpendicular to the axial direction of the contact, between the conductive layer for grounding and a portion of the contact projecting from the surface of the substrate, is determined so that the contact and the conductive layer for grounding are capacitively-coupled.

In a preferred embodiment, a conductive portion is formed on an inner surface of each of the plurality of holes formed in the substrate; each of the plurality of conductive contacts is inserted into and held in a respective hole of the plurality of holes so that each contact is electrically insulated from the corresponding conductive portion; and each contact has plungers at the both ends thereof and a coupling member which couples the plungers, at least one of the plungers being movable in the thickness direction of the substrate.

In a contact holder according to the present invention, due to the conductive layer for grounding arranged on the outer edge area of the substrate, a change of signal transmission characteristic at the outer edge area may be compensated.

DETAILED DESCRIPTION

Figure 1:
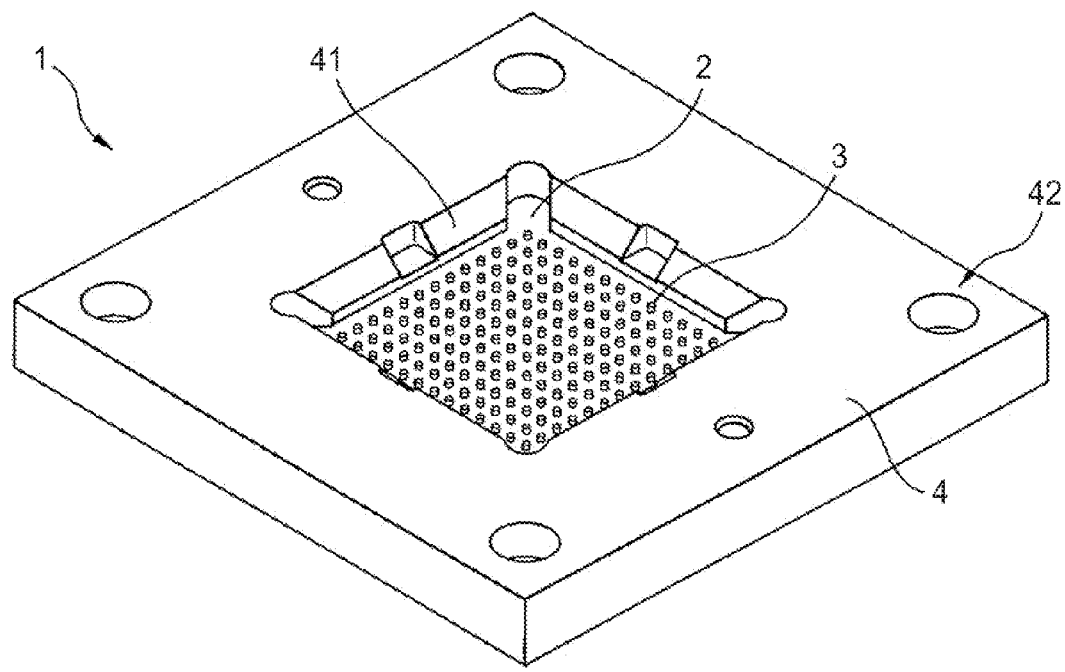
FIG. 1 is a perspective view of a contact holder according to the present invention, provided with a guide.

FIG. 1 is a perspective view of a contact holder with a guide 1 according to one embodiment of the present invention. Contact holder with guide 1 has a contact holder (hereinafter, referred to as a holder) 2, a plurality of conductive contacts 3 held by holder 2, and a guide body 4 which supports holder 2. Guide body 4 has a guide part or a guide wall 41 for locating an electronic device to be tested (not shown) at a predetermined position on holder 2. Guide body 4 further has a positioning part (a positioning hole 42 as shown in FIG. 1) for locating holder 1 at a predetermined position of a testing device (not shown) which tests the electronic device. Guide body 4 may have a positioning pin or a notch, instead of positioning hole 42.

Figure 2:
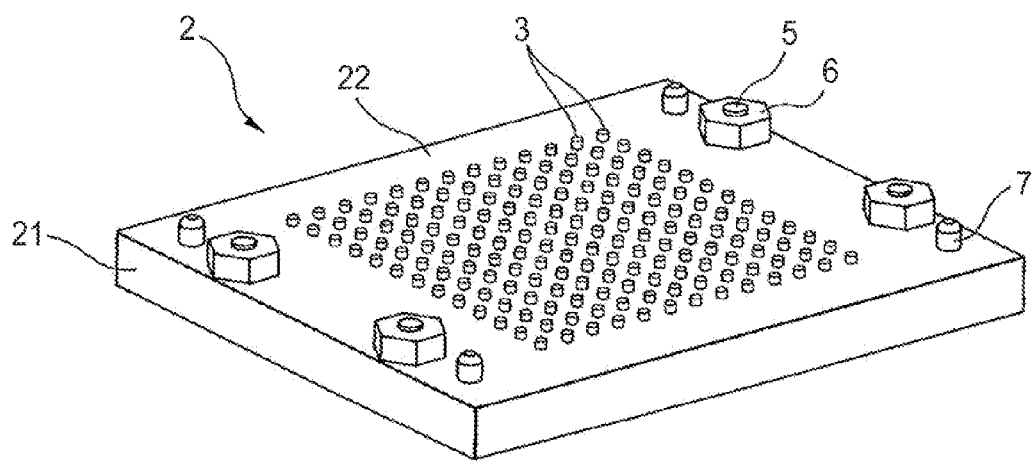
FIG. 2 is a perspective view of the contact holder of FIG. 1.

FIG. 2 is a perspective view of holder 2 of FIG. 1. Holder 2 has a substrate 21 like a plate or a layer, made from insulating material such as glass epoxy. Each contact 3 is held by (for example, pressed into) substrate 2 so as to extend generally perpendicular to a surface 22 of substrate 21. In the example of FIG. 2, holder 2 has plate-like substrate 21 and a connecting part within the substrate, as described below. Holder 2 may have a positioning pin 7 which engages a positioning hole (not shown) formed on guide body 4. In addition, holder 2 may be formed by a substantially integral substrate, or may be dividable so as to facilitate assembling contacts 3, as described below.

Figure 3:
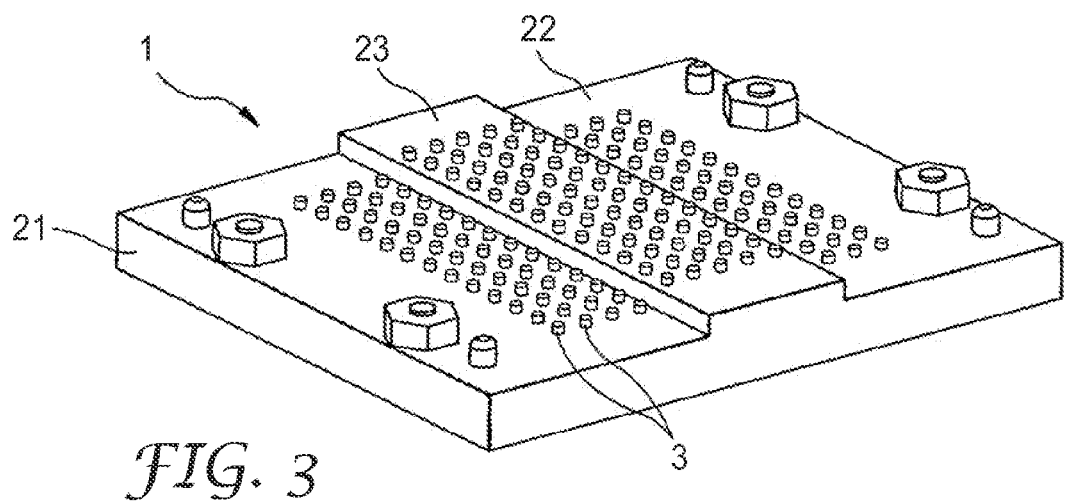
FIG. 3 is a perspective view of a modification of the contact holder of FIG. 2.

FIG. 3 is a perspective view of a modification of holder 2 of FIG. 2. In this modification, a surface of substrate 21 is not a substantially one plane, and has a plurality of (two in the embodiment) planes 22, 23 formed by a step or the like. As such, the holder may have the suitable configuration depending on the shape of the contact and/or the electronic device to be tested.

Figure 4:
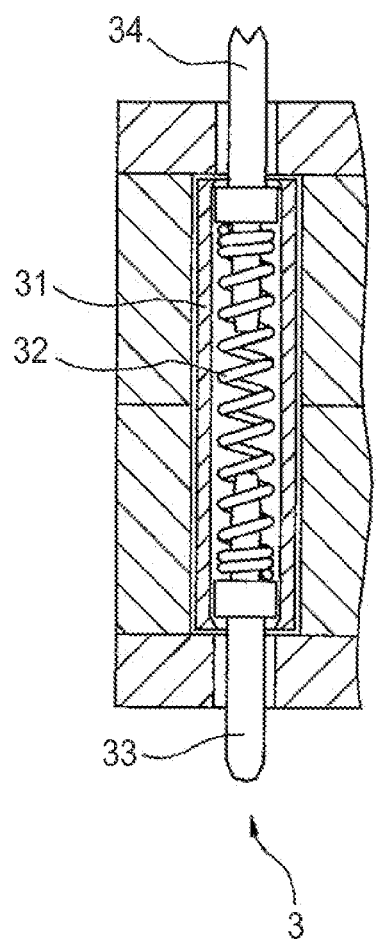
FIG. 4 is a view showing a structural example of a contact.

FIG. 4 shows an example of the concrete structure of each contact. Contact 3 has a generally cylindrical conductive hollow outer shell 31 inserted into a hole for contact (as described below) formed on holder 2, an elastic member 32 (coil spring in the example) disposed within outer shell 31 and capable of expanding or contracting in an axial direction of outer shell 31, a first conductive plunger 33 positioned at one end (the lower end in the embodiment) of coil spring 32 and projecting from one end (the lower end in the embodiment) of outer shell 31 so as to electrically contact a testing device (not shown), and a second conductive plunger 34 positioned at the other end (the upper end in the embodiment) of coil spring 32 and projecting from the other end (the upper end in the embodiment) of outer shell 31 so as to electrically contact an electronic device (not shown). Each of first and second plungers 33 and 34 contacts outer shell 31, and thus the first and second plungers are electrically connected to each other via outer shell 31. Alternatively or additionally, coil spring 32 may be made from conductive material, so that the first and second plungers are electrically connected to each other via coil spring 32. The structure of each contact in the following embodiments is the same as FIG. 4, i.e., has an outer shell and at least one plunger which is movable relative to the outer shell and has the diameter smaller than the diameter of the outer shell.

Figure 5:
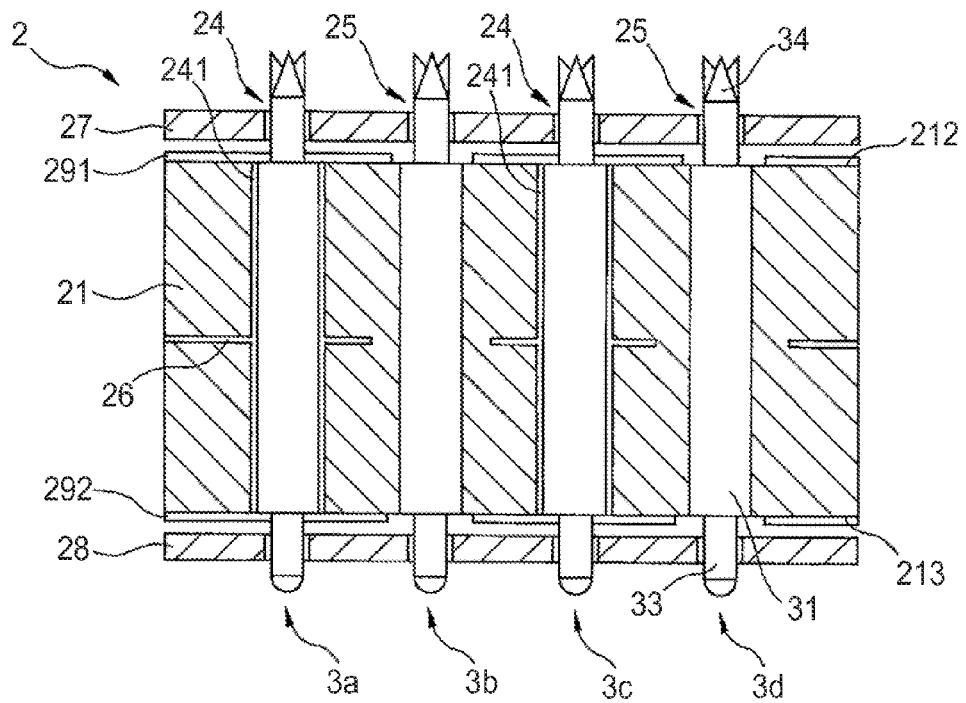
FIG. 5 is a cross-sectional view of a contact holder according to a first embodiment.

FIG. 5 is a cross-sectional view of holder 2 of the first embodiment as shown in FIG. 2, indicating a cross-section parallel to the extending direction of the contact. Holder 2 has insulating substrate 21 and a plurality of (four in the embodiment) contacts 3a to 3d inserted into and held by substrate 21. In the first embodiment, contacts 3a and 3c are contacts for grounding (or grounding contacts), contact 3b is a contact for signal transmitting (or signal transmitting contact), and contact 3d is a signal transmitting contact or another contact such as a contact for power supplying (or power supplying contact).

Each contact extends generally perpendicular to a surface 22 of holder 2 and passes through holder 2. In detail, contacts 3a, 3c are held by press fitting, in first holes for contact 24 formed in substrate 21 constituting holder 2, and a conductive portion 241, such as copper, silver or gold, is provided on an inner surface of each hole for contact 24 by plating or the like. Therefore, contacts 3a, 3c are at least partially electrically connected to conductive portion 241. On the other hand, contact 3b is held by press fitting, in a second hole for contact 25 formed in substrate 21 constituting holder 2. In the exemplary embodiment, outer shell 31 of each contact is held by plate-like substrates 27, 28 each having a hole with a diameter smaller than an outer diameter of outer shell 31. Plate-like substrates 27, 28 have function to avoid drop of each contact and control the displacement or deflection of a front end of the plunger in the direction generally perpendicular to the axial direction of each contact.

Holder 2 has a connecting part 26, which is positioned in substrate 21, adapted to electrically connect conductive portions 241 to each other. In the embodiment of FIG. 5, connecting part 26 is a conductive layer positioned in plate-like substrates 21, however, connecting part 26 may be constituted from wires. By electrically connecting conductive portions 241 to each other by means of connecting part 26, contacts 3a, 3c, inserted into hole 24, may be electrically connected to connecting part 26 via conductive portion 241.

Substrate 21 has a grounded layered conductive members (or conductive layers) for grounding 291, 292, positioned on or above surfaces 212, 213 of the substrate, near the plunger of signal transmitting contact 3b. Each conductive layer for grounding (or grounding conductive layer) is electrically connected to conductive portion 241 electrically connected to each grounding contact, on surface 212 or 213 of substrate 21, and is not electrically connected to the signal transmitting contact. As such, by arranging the conductive layer, which is equipotential with the ground, near the plunger having the diameter smaller than the diameter of the outer shell, an inductance component at the plunger may be compensated, whereby an insertion loss or a near-end cross-talk of the signal transmitting contact may be reduced. The grounding conductive layer may be formed on the surface of substrate 21 by a normal multi-layer substrate manufacturing process. Further, a larger capacitance may be obtained than when the grounding conductive layer is arranged within the substrate. In the embodiment of FIG. 5, grounding conductive layers 291, 292 are separated from plate-like substrates 27, 28 for clarity, however, the grounding conductive layer may contact the plate-like substrate.

An effect of the present invention will be explained in terms of the characteristic impedance. Characteristic impedance $Z_0$ is represented by a following equation, using a capacitance component $C_0$ and an inductance component $L_0$ per unit length.

$$Z_0 = (L_0/C_0)^{1/2}$$

Generally, it is preferable that the characteristic impedance is constant throughout a signal transmission path. However, when the characteristic impedance should be controlled at the outer shell of the spring probe or a through hole into which the outer shell is inserted, the plunger functions as the inductance rather than the capacitance, in relation to the ratio $L_0/C_0$, since the inductance component per unit length is increased due to the diameter of the plunger smaller than the diameter of the outer shell, and the capacitance component is decreased due to the larger distance between the plunger and the grounding conductive layer. Therefore, the characteristic impedance at the plunger appears to be increased. However, by arranging the grounding conductive layer near the plunger having the high characteristic impedance and capacitively-coupling between the ground and the plunger, the characteristic impedance may be reduced.

Further, when a cross-talk exists due to electrically coupling between the signal transmitting contacts, the crosstalk between neighboring signal transmitting contacts may be reduced by arranging the grounding conductive layer near the signal transmitting contacts, due to electrically coupling between the signal transmitting contact and the grounding contact.

Figure 6:
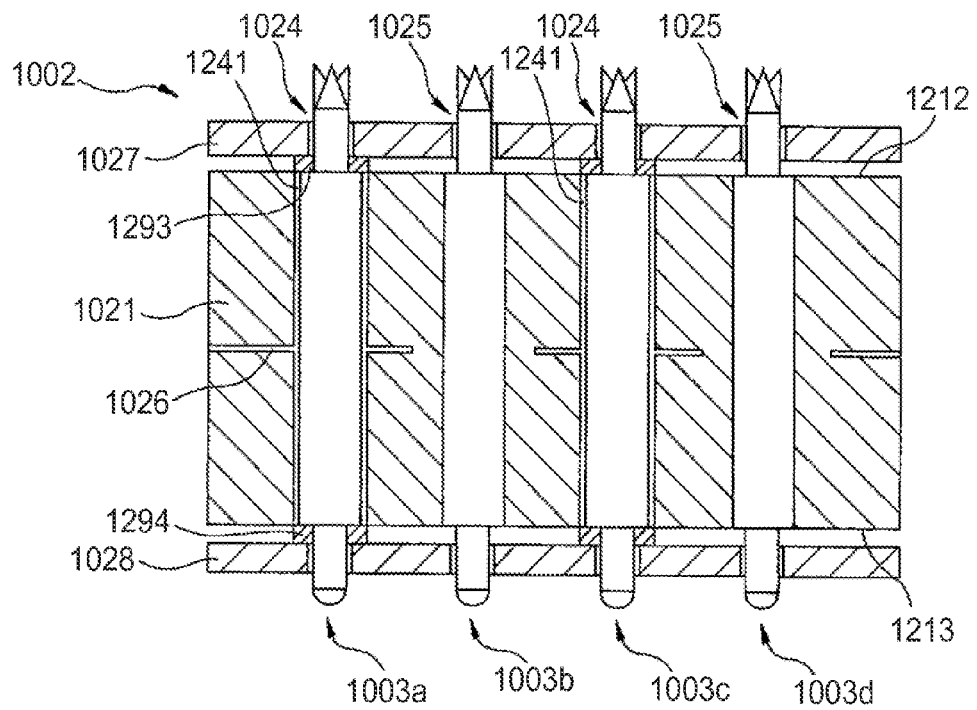
FIG. 6 is a cross-sectional view of a contact holder according to a second embodiment.

FIG. 6 is a cross-sectional view of a holder 1002 used in the second embodiment. The second embodiment is different from the first embodiment in that grounded plate-like substrates 1027, 1028 are formed by conductive material and, instead of grounding conductive layers 291, 292 of the first embodiment, are electrically connected to a conductive portion 1241 formed on an inner surface of each hole for contact 1024 by plating or the like. To this end, an annular conductive member 1293 is positioned between a surface 1212 of a substrate 1021 and plate-like substrate 1027, so as to electrically connect conductive portion 1241 to plate-like substrate 1027. Similarly, an annular conductive member 1294 is positioned between a surface 1213 of substrate 1021 and plate-like substrate 1028, so as to electrically connect conductive portion 1241 to plate-like substrate 1028.

In the second embodiment, plate-like substrates 1027, 1028, having the function to avoid drop of each contact and control the displacement or deflection of the front end of the plunger, may also function as the grounding conductive material. Therefore, it is preferable that an insulating material is positioned between each contact and substrate 1027 or 1028, so that the contact and the plate-like substrate do not electrically contact each other. The second embodiment is suitable for compensating the inductance component of the plunger when the plunger is relatively long. The other elements of the second embodiment may be the same as those of the first embodiment, and thus the detailed explanation thereof is omitted, instead, 1000 is added to reference numeral of the corresponding elements of the first embodiment for indicating the elements of the second embodiment.

Figure 7:
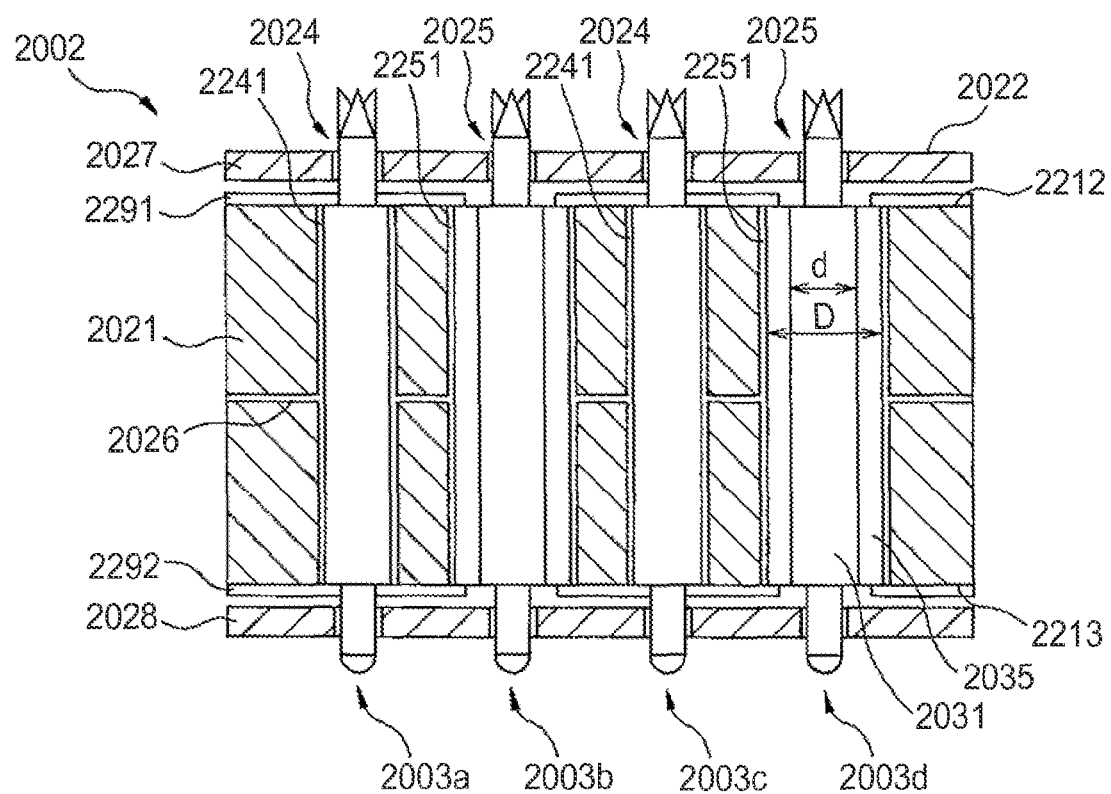
FIG. 7 is a cross-sectional view of a contact holder according to a third embodiment.

Next, an embodiment, wherein the signal transmitting contact constitutes a coaxial transmission line, will be explained. FIG. 7 is a cross-sectional view of a third embodiment, indicating a cross-section parallel to the extending (axial) direction of the contact. Holder 2002 has insulating substrate 2021 and a plurality of (four in the embodiment) contacts 2003a-2003d inserted into and held by substrate 2021. In the third embodiment, contacts 2003a and 2003c are contacts for grounding, and contacts 2003b and 2003d are contacts for signal transmitting (or signal transmitting contact).

Each contact extends generally perpendicular to a surface 2022 of holder 2002 and passes through holder 2002. In detail, contacts 2003a, 2003c are held by press fitting, in first holes for contact 2024 formed in substrate 2021 constituting holder 2002, and a conductive portion 2241, such as copper, silver or gold, is provided on an inner surface of each hole for contact 2024 by plating or the like. Therefore, contacts 2003a, 2003c are at least partially electrically connected to conductive portion 2241. On the other hand, contacts 2003b, 2003d are held by press fitting, in second holes for contact 2025 formed in substrate 2021 constituting holder 2002. In the exemplary embodiment, an outer shell 2031 of each contact is held by plate-like substrates 2027, 2028 each having a hole with a diameter smaller than an outer diameter of outer shell 2031. Also, a conductive portion 2251, such as copper, silver or gold, is provided on an inner surface of each hole for contact 2025 by plating or the like. The diameter of the second hole for contact is larger than the diameter of the first hole for contact. Therefore, contacts 2003b, 2003d do not contact conductive portion 2251 (or are insulated from the conductive portion), so that each of contacts 2003b, 2003d and conductive portion 2251 cooperatively constitute a coaxial transmission line.

The term "coaxial transmission line" herein means the configuration wherein outer shell 2031 of the contact is insulated from conductive portion 2251, and outer shell 2031 is covered (or electromagnetically shielded) by the conductive material. In other words, "coaxial transmission line" does not mean only the case wherein the contact and the conductive material have cylindrical shapes which have the same axis. For example, the outer surface of the contact and the inner surface of the conductive material may have cylindrical shapes which are eccentric to each other.

In contacts 2003b, 2003d, a dielectric material 2035, such as resin or ceramics, may be disposed or filled between the outer surface of outer shell 2031 and the inner surface of conductive portion 2251. Otherwise, instead of disposing the dielectric material between the outer surface of outer shell 2031 and the inner surface of conductive portion 2251, an area between them may be gas-phase, such as air, nitrogen or oxygen, or vacuum-phase.

The coaxial transmission line is constituted so as to have predetermined characteristic impedance. For example, when outer shell 2031 of contact 2003b or 2003d has the cylindrical shape with an outer diameter "d" and conductive portion 2251 has the cylindrical shape with an inner diameter "D," and the cylinders are coaxial, characteristic impedance $Z_0$ of the coaxial transmission line may be represented by a following equation. In the equation, "$\epsilon$" is the permittivity of the material (the dielectric material or the gas-phase in the embodiment) between the contact and the conductive portion. By properly determining the parameters "d," "D" and "ε," desired characteristic impedance may be obtained in each signal transmitting contact.

$$Z_0 = 60/\epsilon^{1/2} \cdot \ln(D/d)$$

As shown in FIG. 7, holder 2002 has a connecting part 2026, which is positioned in substrate 2021, adapted to electrically connect conductive portion 2241 to conductive portion 2251. In the embodiment of FIG. 7, connecting part 2026 is a conductive layer positioned in plate-like substrates 2021, however, connecting part 26 may be constituted from wires. By electrically connecting conductive portion 2241 to conductive portion 2251 by means of connecting part 2026, each of contacts 2003a, 2003c, inserted into through hole for contact 2024, may be electrically connected to connecting part 2026 via conductive portion 2241.

Holder 2002 may be formed as a substantial unified unit, otherwise, may be formed by combining some components in view of assembling of the contacts or positioning the connecting part. For example, in order to dispose layered connecting part 2026 within the holder, plate-like substrate 2021 is constituted by stacking a plurality of layers and disposing connecting part 2026 between the layers. Further, in order to facilitate forming the conductive portion (for example, a conductive coating) on the inner surface of the hole for contact, plate-like substrates 2027, 2028 may be bonded to substrate 2021 after forming the conductive portion on the inner surface of the hole for contact, wherein the thickness of substrate 2021 is equal to the length of outer shell 2031 of each contact.

Substrate 2021 has a grounded layered conductive members (or conductive layers) for grounding 2291, 2292, positioned on or above surfaces 2212, 2213 of the substrate, near the plunger of signal transmitting contacts 2003b, 2003d. Each conductive layer for grounding (or grounding conductive layer) is electrically connected to conductive portion 2241 electrically connected to each grounding contact, on surface 2212 or 2213 of substrate 2021, is electrically connected to conductive portion 2251 constituting the coaxial structure with the signal transmitting contact, on surface 2212 or 2213 of substrate 2021, and is not electrically connected to the signal transmitting contacts. As such, by arranging the grounding conductive layer, which is equipotential with the ground, near the plunger having the diameter smaller than the diameter of the outer shell, an inductance component at the plunger may be compensated, whereby an insertion loss or a near-end cross-talk of the signal transmitting contact may be reduced. The grounding conductive layer may be formed on the surface of substrate 2021 by a normal multi-layer substrate manufacturing process. Further, a larger capacitance may be obtained than when the grounding conductive layer is arranged within the substrate. In the embodiment of FIG. 7, grounding conductive layers 2291, 2292 are separated from plate-like substrates 2027, 2028 for clarity, however, the grounding conductive layer may contact the plate-like substrate.

As in the third embodiment of FIG. 7, when the holder has the outer shell constituting the coaxial structure, characteristic impedance $Z_0$ may be defined as in the above equation in relation to the coaxial structure. In the prior art, the plunger is not surrounded by the grounding conductive material, and thus the plunger functions as the inductance. Therefore, as in the third embodiment, by arranging the grounding conductive layer near the plunger so as to add capacitance component between the plunger and the ground, the inductance component of the plunger is compensated and the characteristic is improved. In detail, when capacitance component Co exists between the plunger and the ground so as to satisfy ($Z_0=(L_0/C_0)^{1/2}$ (where $L_0$ is the inductance at the plunger), the difference between the characteristic impedance of the plunger and the characteristic impedance of the outer shell is within a predetermined error range, whereby the deterioration of the high-frequency characteristic may be compensated. Further, simultaneously, when the signal transmitting contact and the grounding contact are electrically coupled to each other, a cross-talk between the neighboring signal transmitting contacts may be reduced.

Figure 8:
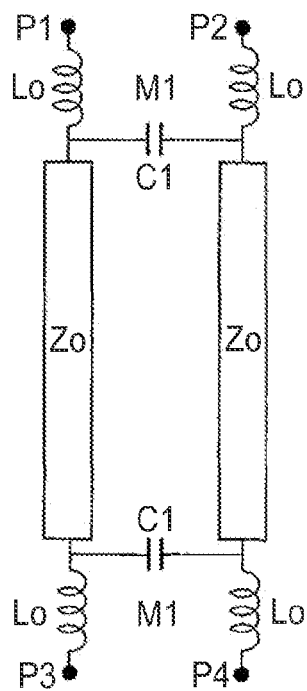
FIG. 8 is a schematic view of an equivalent circuit of a socket having two signal transmitting members and an outer shell forming a coaxial structure.
Figure 9:
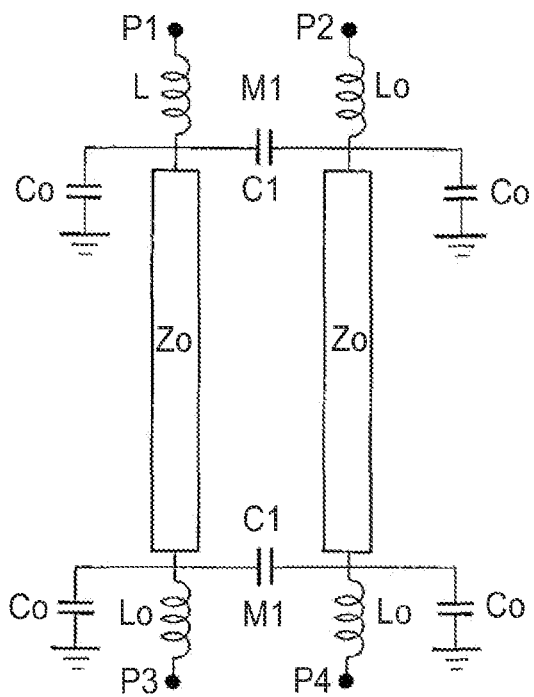
FIG. 9 is a schematic view of an equivalent circuit of FIG. 8, when a grounding conductive member is positioned near a plunger.

The third embodiment of FIG. 7 is represented by means of a simplified electric circuit model and simulated by a circuit simulation. First, as a comparative example, FIG. 8 shows an equivalent circuit of a socket having two signal transmitting members and an outer shell forming a coaxial structure. In FIG. 8, $Z_0$, $L_0$, C1 and M1 represent a characteristic impedance of the outer shell (or the coaxial structure), a self-inductance component of the plunger, a capacitance component between the plunger and the conductive material, and a mutual inductance component between two plungers, respectively. On the other hand, FIG. 9 shows an equivalent circuit of a socket, wherein the grounding conductive material is positioned near the plunger, as in the third embodiment. In this connection, $C_0$ represents a capacitance component between the plunger and the ground due to the conductive material positioned near the plunger. In this case, it is assumed that the electrical connection between the grounding conductive material and the signal conductive material is due to capacitive coupling only.

In order to realize the compensating effect at the plunger due to the grounding conductive material, under the condition C1 « $C_0$, if $Z_0=(L_0/C_0)^{1/2}$ is true, the characteristic of the outer shell coincides with the characteristic of the plunger. Further, the cross-talk generated by the capacitive coupling between the neighboring contacts, according to C1, is reduced by the capacitive coupling between the ground and the plunger in relation to $C_0$.

Figure 10:
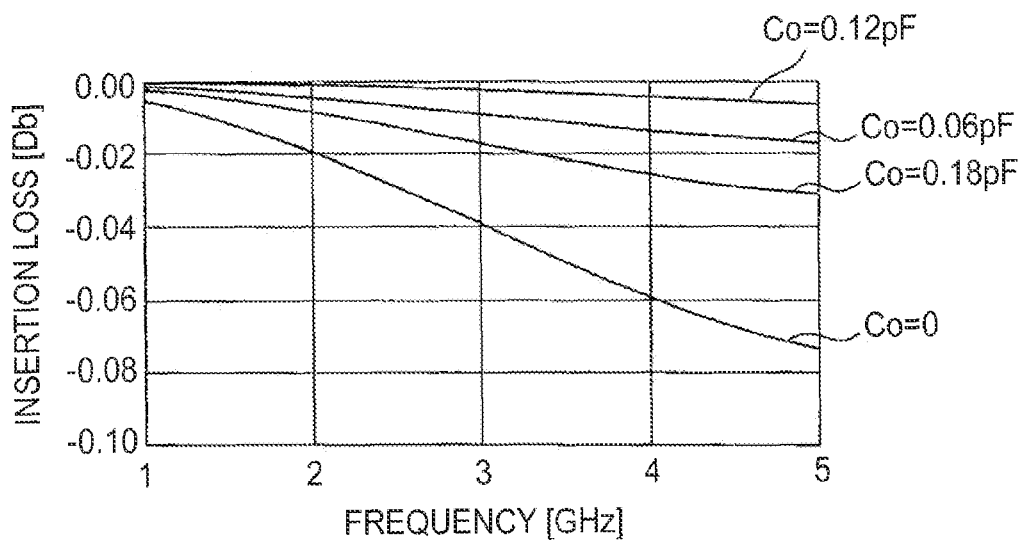
FIG. 10 is a graph of insertion loss calculated by simulation using models of FIGS. 8 and 9.
Figure 11:
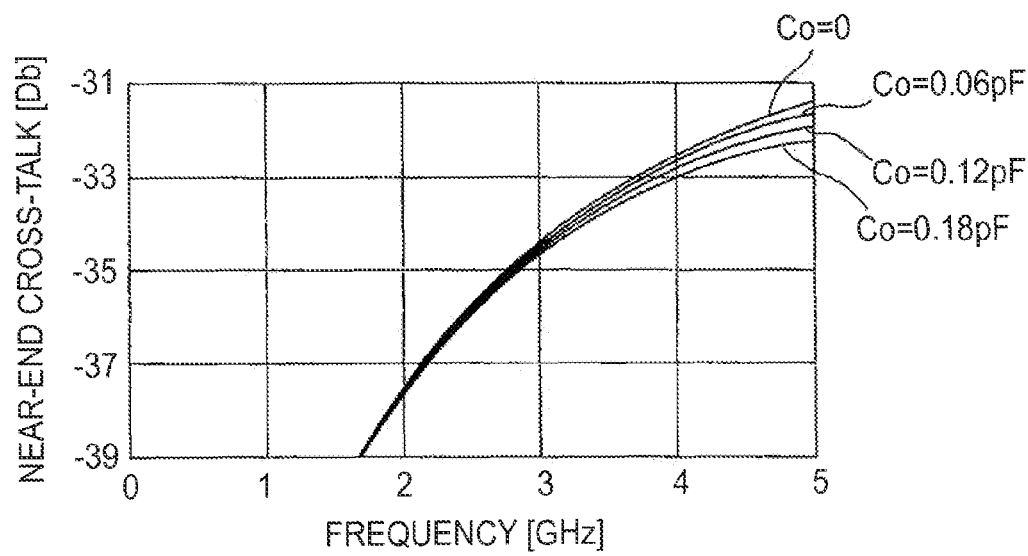
FIG. 11 is a graph of near-end cross-talk calculated by simulation using models of FIGS. 8 and 9.

FIGS. 10 and 11 show results of circuit simulation which calculates insertion loss and near-end cross-talk, respectively. In FIGS. 10 and 11, the insertion loss (FIG. 10) and the near-end cross-talk (FIG. 11) are simulated by using a high-frequency circuit simulator, in relation to four ports P1 to P4 in FIGS. 8 and 9, where $Z_0$=50Ω, C1=0.01 pF, $L_0$=0.3 nH, and M1=0.03 nH. The value of $C_0$ is varied from zero to 0.18 pF in intervals of 0.06 pF (i.e., 0, 0.06, 0.12 and 0.18 pF), and the condition where $C_0$=O corresponds to the circuit of FIG. 8. When $C_0$=O. 12 pF, ($L_0/C_0$) ½ is equal to 50Ω or the above $Z_0$), the insertion loss of when is smallest.

Apparent from the result of the above simulation, even in a socket having a spring probe which does not constitute the coaxial structure as shown in FIGS. 5 and 6, by arranging spring probes for grounding and signal transmitting, certain characteristic impedance may be defined at the outer shell. Further, by positioning a grounding conductive layer having the same electric potential as the ground, near the plunger, the similar effect as described below may be obtained.

When the inductance component to be compensated is relatively large, larger capacitance component is necessary regardless of the existence of the coaxial structure. In this connection, if lumped-constant capacitance component is arranged, such a capacitance component may function as a filter for a certain frequency, whereby the characteristic relative to the frequency is widely varied. Therefore, the characteristic may be improved by compensating the inductance by means of distributed-constant structure. For example, a plunger to be compensated is relatively long, improved characteristic is obtained by compensating the plunger by means of the ground as shown in FIG. 6.

Generally, capacitance value C of a parallel-plate capacitor having two plates, each having area "S" and separated from each other by distance "d," and dielectric material having dielectric constant of "e" filled between the plates, is represented by a following equation.

$$C = eS/d$$

Apparent from the equation, the capacitance becomes larger as distance "d" is smaller and area "S" is larger. Therefore, in order to obtain sufficient capacitance component for compensating the inductance component of the plunger, it is preferable that the grounding conductive layer having the same electric potential as the ground has a wide area and is positioned near the plunger. When the above grounding conductive layer is used so as to add ground component to an IC socket having a multi-layered substrate, for improving the characteristic of the IC socket, such a grounding conductive layer may be realized by a conventional multi-layered substrate manufacturing process. In this case, larger capacitance component may be obtained relative to a case wherein the grounding conductive layer is arranged as an inner layer.

Figure 12:
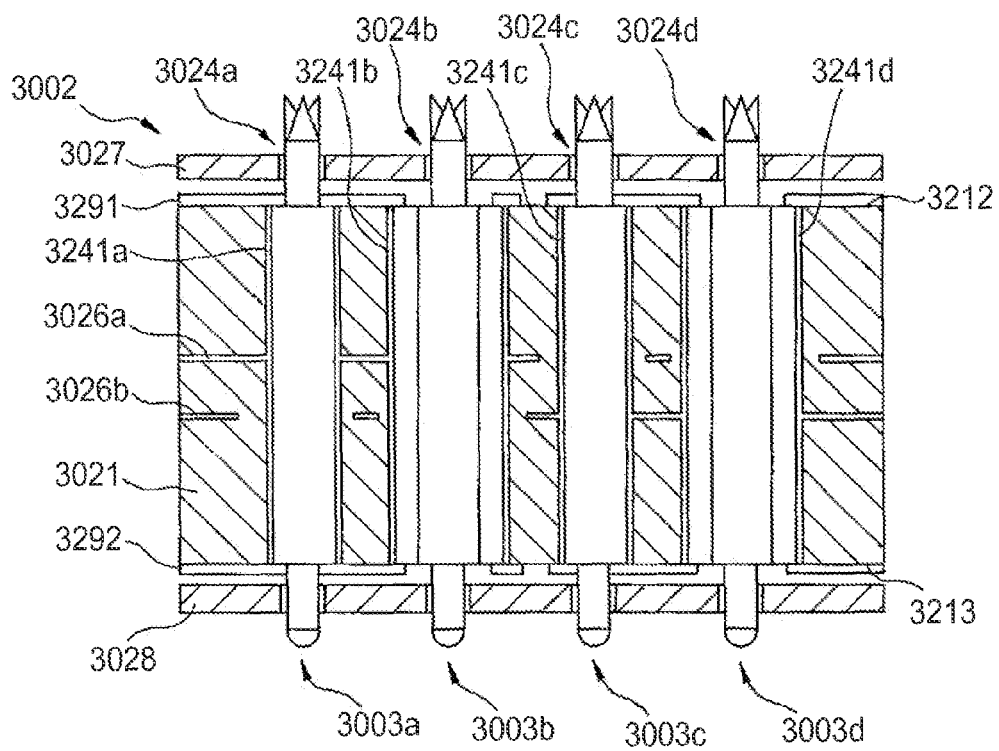
FIG. 12 is a cross-sectional view of a contact holder according to a fourth embodiment.

In an actual test socket, an inductance component and a resistance component of the conductive structure and dielectric material constituting a capacitance component also have frequency dependency. Therefore, as shown in FIGS. 11 and 12, a simplified circuit including simple elements having no frequency dependency does not correctly represent the transmission characteristic. However, when the characteristic of a signal terminal of the IC socket may be deteriorated due to the existence of a portion which functions as the inductance, the transmission property of the IC socket may be improved by adding the capacitance component between the ground and the signal terminal.

FIG. 12 shows a cross-sectional view of a holder 3002 used in a contact holder according to a fourth embodiment. Holder 3002 has two connecting parts 3026a, 3026b, whereby the contact holder may have two ground systems or grounding conductive materials. Concretely, first connecting part 3026a electrically connects a conductive portion 3241a, formed on an inner surface of a hole for contact 3024a into which a contact 3003a is inserted, to a conductive portion 3241b, formed on an inner surface of a hole for contact 3024b into which a contact 3003b is inserted. Similarly, second connecting part 3026b electrically connects a conductive portion 3241c, formed on an inner surface of a hole for contact 3024c into which a contact 3003c is inserted, to a conductive portion 3241d, formed on an inner surface of a hole for contact 3024d into which a contact 3003d is inserted. Further, first and second connecting parts 3026a and 3026b are insulated from each other. The contact holder may have three or more connecting parts, so as to configure three or more ground systems. When three or more ground systems are used, it is necessary to divide each of grounding conductive layers 3291 and 3292 as described below, depending on which ground system each grounding contact should be connected to. In the fourth embodiment, each connecting part may be constituted as a conductive layer. In the fourth embodiment, it is assumed that contacts 3003a and 3003c are grounding contacts, and contacts 3003b and 3003d are signal transmitting contacts.

In the fourth embodiment, substrate 3021 of holder 3002 is made from dielectric material, not conductive material such as metal, and thus a plurality of ground systems may be easily disposed in the substrate. When the contact holder has a plurality of ground systems, even when different signals, such as analogue and digital signals, high and low frequency signals or high and low amplitude signals, should be transmitted through the contact holder, an independent ground system suitable for each of the different signals may be configured, whereby the signal passing through the transmission line may be stable.

Substrate 3021 has a grounded layered conductive members (or conductive layers) for grounding 3291, 3292, positioned on or above surfaces 3212, 3213 of the substrate, near the plunger of signal transmitting contacts 3003b, 3003d. Each conductive layer for grounding (or grounding conductive layer) is electrically connected to conductive portion 3241a or 3241c electrically connected to the grounding contact, on surface 3212 or 3213 of substrate 3021, is electrically connected to conductive portion 2241b or 2241d constituting the coaxial structure with the signal transmitting contact, on surface 2212 or 2213 of substrate 2021, and is not electrically connected to the signal transmitting contacts. As such, by arranging the grounding conductive layer, which is equipotential with the ground, near the plunger having the diameter smaller than the diameter of the outer shell, an inductance component at the plunger may be compensated, whereby an insertion loss or a near-end cross-talk of the signal transmitting contact may be reduced. The grounding conductive layer may be formed on the surface of substrate 3021 by a normal multi-layer substrate manufacturing process. Further, a larger capacitance may be obtained than when the grounding conductive layer is arranged within the substrate. In the embodiment of FIG. 12, grounding conductive layers 3291, 3292 are separated from plate-like substrates 3027, 3028 for clarity, however, the grounding conductive layer may contact the plate-like substrate.

Figure 13:
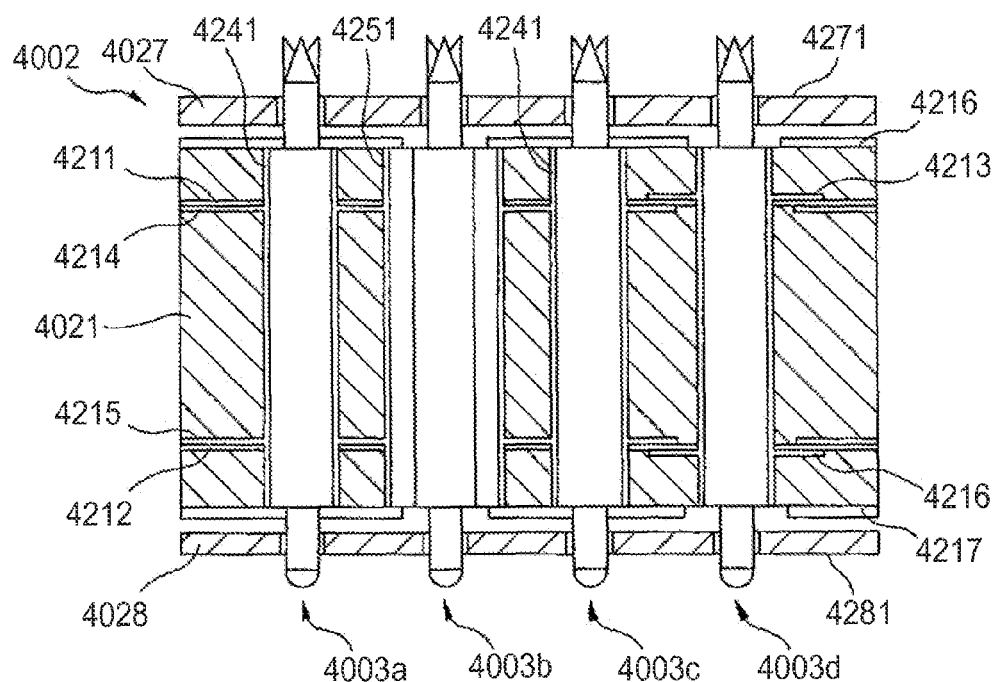
FIG. 13 is a cross-sectional view of a contact holder according to a fifth embodiment.

FIG. 13 is a cross-sectional view of a holder 4002 used in a contact holder according to a fifth embodiment of the invention. Holder 4002 may have at least one (two in the embodiment) layered dielectric member 4211, 4212 positioned within substrate 4021 made from insulative material such as glass epoxy. A power supplying conductive layer 4213 and a grounding conductive layer 4214 are formed on both sides of layered dielectric member 4211, and a grounding conductive layer 4215 and a power supplying conductive layer 4216 are provided on both sides of layered dielectric member 4212. Therefore, each layered dielectric member and the conductive layers on the both sides thereof cooperatively constitute a capacitor between the power supplying and grounding conductive layers. In other words, holder 4002 is constituted by stacking the insulative material or the substrate, the conductive layers and the layered dielectric member. In order to ensure power supplying to the device, stabilize the electric potential of the power source and the ground so as to stabilize the operation of the device, it is effective to arrange a capacitor having a sufficient capacitance between the power and the ground. Further, in order to increase the capacitance of the capacitor, it is preferable that a dielectric constant of each layered dielectric member is high as possible, and that each layered dielectric member is a high dielectric member having the higher dielectric constant than that of substrate 4021. As the high dielectric material, an "Embedded Capacitor Material (ECM)", available from 3M Company, may be used. The ECM is provided as a flexible sheet from the high-dielectric material. Such a holder may be made by a method of making a printed-circuit board.

The layered dielectric member may include polymer. Preferably, the layered dielectric member includes polymer and a plurality of particles. Concretely, the layered dielectric member may be made by mixing resin and particles. Preferable resin may include epoxy, polyimide, polyvinylidene-fluoride, cyanoethyl pullulan, benzocyclobutene, polynorbornene, polytetrafluoro-ethylene, acrylate, and the mixture thereof. The particles may include dielectric (insulating) particles, for example, barium titanate, barium titanate strontium, oxidized titanium, lead titanate zirconium, and the mixture thereof.

For example, the thickness of each layered dielectric member may be equal to or larger than 0.5 μm. The thickness of each layered dielectric member may be equal to or smaller than 20 μm. The smaller the thickness, the larger is the electrostatic capacity of the capacitor. For example, the thickness may be equal to or smaller than 15 μm, or 10 μm. On the other hand, the larger the thickness, the stronger is the adhesive strength or insulating capacity. For example, the thickness may be equal to or larger than 1 μm.

It is preferable that the relative permittivity of the layered dielectric member is high as possible. For example, the relative permittivity may be equal to or larger than 10 or 12. Although there is no upper limit of the relative permittivity, the relative permittivity may be equal to or smaller than 100, 30, 20 or 16.

When the high-dielectric material is used as the layered dielectric member, the distance between the neighboring capacitors may be advantageously reduced. When two capacitors are positioned close to each other, the electrostatic capacitance may also be obtained between the grounding conductive layer of one capacitor and the grounding conductive layer of another neighboring capacitor. In the case that the high-dielectric material is used between the conductive layers, by which the electrostatic capacitance should be obtained, even when the distance between the conductive layers of one capacitor and the distance between two neighboring capacitors are equal to each other, the electrostatic capacitance of each capacitor may be increased. Therefore, the distance between the neighboring capacitors may be relatively small, whereby the thickness of the holder may be reduced.

The conductive layers, formed on the both sides of each high-dielectric layer, constitute a grounding conductive layer electrically connected to the grounding contact and a power supplying conductive layer electrically connected to the power supplying contact. In detail, one of conductive layer 4213 on the upper side of first high-dielectric material 4211, close to an electronic device-side surface (a top surface in FIG. 13) 4271 of the holder, and conductive layer 4214 on the lower side of first high-dielectric material 4211 may function as the grounding conductive layer, and the other may function as the power supplying conductive layer. Similarly, one of conductive layer 4215 on the upper side of second high-dielectric material 4212, close to a testing device-side surface (a bottom surface in FIG. 13) 4281 of the holder, and conductive layer 4216 on the lower side of second high-dielectric material 4212 may function as the grounding conductive layer, and the other may function as the power supplying conductive layer. In other words, in the embodiment of FIG. 13, contacts 4003*a*, 4003*c* connected to grounding conductive layers 4214, 4215 may function as the grounding contacts, and contact 4003*d* connected to power supplying conductive layers 4213, 4216 may function as the power supplying contacts. Further, contact 4003*b* of the coaxial transmission line, which is not connected to either of the layers, functions as the signal transmitting contact.

Each high-dielectric layer and the conductive layers on the both sides thereof may be provided on whole area of the holder. In this case, an area of the capacitor thus formed may be generally the same as that of the holder.

As shown in FIG. 13, it is preferable that the capacitor of holder 4002, having the high-dielectric layer sandwiched by the grounding conductive layer and the power supplying conductive layer, is positioned as close as possible to top surface 4271 or bottom surface 4281 of holder 4002. This is because, the smaller the distance between the surface of holder 4002 and the conductive layer is, the performance of the power supply and the ground may be more stable during testing the electronic device. Concretely, the smaller the distance between top surface 4271 of holder 4002 and high-dielectric member 4211 is, the input sensitivity of the electronic device to be tested is more improved, and the smaller the distance between bottom surface 4281 of holder 4002 and high-dielectric member 4212 is, the output sensitivity of the electronic device is more improved. In the present invention, the holder, including the high-dielectric layer sandwiched by the grounding conductive layer and the power supplying conductive layer, is substantially unified, thus the capacitor may be easily positioned close to the surface of the holder, whereby the test of the electronic device can be carried out with a high degree of accuracy.

Substrate 4021 has a grounded layered conductive members (or conductive layers) for grounding 4291, 4292, positioned on or above surfaces 4216, 4217 of the substrate, near the plunger of signal transmitting contact 4003*b*. Each conductive layer for grounding (or grounding conductive layer) is electrically connected to conductive portion 4241 electrically connected to the grounding contact, on surface 4216 or 4217 of substrate 4021, is electrically connected to conductive portion 4251 constituting the coaxial structure with the signal transmitting contact, on surface 4216 or 4217 of substrate 4021, and is not electrically connected to the signal transmitting contact. As such, by arranging the grounding conductive layer, which is equipotential with the ground, near the plunger having the diameter smaller than the diameter of the outer shell, an inductance component at the plunger may be compensated, whereby an insertion loss or a near-end cross-talk of the signal transmitting contact may be reduced. The grounding conductive layer may be formed on the surface of substrate 4021 by a normal multi-layer substrate manufacturing process. Further, a larger capacitance may be obtained than when the grounding conductive layer is arranged within the substrate. In the embodiment of FIG. 13, grounding conductive layers 4291, 4292 are separated from plate-like substrates 4027, 4028 for clarity, however, the grounding conductive layer may contact the plate-like substrate.

Although five embodiments are explained above, another embodiment, including two or more features in the five embodiments, may be possible. For example, in the third embodiment of FIG. 7, plate-like members 2027 and 2028 may be made from conductive material as in the second embodiment, whereby grounding conductive layers 2291 and 2292 may be omitted.

The material constituting the holder may include paper instead of glass fiber, and may include phenol resin or polyamide resin instead of epoxy resin. As the material constituting the conductive layer or conductive member, silver or gold may be used instead of copper.

In the above embodiments, each contact extends through the holder. However, at least one contact may partially extend (or terminate) in the holder in the thickness direction of the holder. In this case, the contact which terminates in the holder and another contact may be electrically connected by a connecting means similar to connecting part 26 as described above. Due to this, a pitch of arranged contacts on the top surface of the holder may be different from that on the bottom surface of the holder.

Reference Signs List

1 contact holder with guide
2 contact holder
21 substrate
24, 25 hole for contact 291, 292 conductive layer for grounding
3a, 3b, 3c, 3d contact
31 outer shell
32 coil spring
33 first plunger
34 second plunger

What is claimed is:

1. A contact holder adapted to contact a plurality of terminals of an electronic device to corresponding contacts of a circuit board, comprising:
    an insulating substrate;
    a plurality of conductive contacts, each inserted into and held in each of a plurality of holes formed in the substrate, wherein a conductive portion is formed on an inner surface of each of the plurality of holes, each of the plurality of conductive contacts is inserted into and held in a respective hole of the plurality of holes so that each contact is electrically insulated from the corresponding conductive portion, and each contact has plungers at the both ends thereof and a coupling member which couples the plungers, at least one of the plungers being movable in the thickness direction of the substrate;
    wherein the substrate has a conductive layer positioned on or above a surface of the substrate, and wherein the conductive layer is arranged so that a surface of the conductive layer is generally perpendicular to an axial direction of the contact.

2. The contact holder according to claim 1, wherein a distance, in the direction perpendicular to the axial direction of the contact, between the conductive layer for grounding and a portion of the contact projecting from the surface of the substrate, is determined so that the contact and the conductive layer for grounding are capacitively-coupled.

3. The contact holder according to claim 1, wherein each contact has a generally cylindrical outer shell and plungers arranged on both ends of the outer shell, at least one of the plungers being movable in the axial direction of the shell.

4. The contact holder according to claim 1 or 3, further comprising a connecting part arranged in the substrate and adapted to electrically connect each conductive portion to each other.

5. The contact holder according to anyone of claim 1, 3 or 4, further comprising:
    at least one layered dielectric member arranged in the substrate, the at least one layered dielectric member having a dielectric constant higher than the substrate; and
    layered conductive members, arranged in the substrate and provided on both sides of the layered dielectric member,
    wherein at least one of the conductive portions, each formed on the inner surface of each hole formed in the substrate, is electrically connected to one of the layered conductive members provided on the layered dielectric member.

6. The contact holder according to anyone of claims 1 or 3 to 5, wherein a dielectric member is positioned between an outer surface of the contact and the conductive portion formed on the inner surface of the hole into which the contact is inserted.

* * * * *